United States Patent [19]

Takeuchi et al.

[11] Patent Number: 5,615,145
[45] Date of Patent: Mar. 25, 1997

[54] SEMICONDUCTOR MEMORY WITH FERROELECTRIC CAPACITORS

[75] Inventors: Kan Takeuchi, Kodaira; Katsumi Matsuno, Kokubunji; Kazuhiko Kajiyama, Iruma; Osamu Nagashima, Hamura; Masatoshi Hasegawa, Ome, all of Japan

[73] Assignee: Hitachi, Ltd., Tokyo, Japan

[21] Appl. No.: 580,090

[22] Filed: Dec. 20, 1995

[30] Foreign Application Priority Data

Dec. 20, 1994 [JP] Japan ..................... 6-316295

[51] Int. Cl.$^6$ ..................... G11C 11/22
[52] U.S. Cl. ..................... 365/145; 365/149; 365/65; 365/102
[58] Field of Search ..................... 365/149, 102, 365/145, 65

[56] References Cited

U.S. PATENT DOCUMENTS 5,383,150  1/1995  Nakamura et al. ..................... 365/145

Primary Examiner—David C. Nelms
Assistant Examiner—F. Niranjan
Attorney, Agent, or Firm—Antonelli, Terry, Stout & Kraus, LLP

[57] ABSTRACT

A semiconductor memory which includes a plurality of memory cells each having first and second capacitors connected in series and a field-effect transistor whose source or drain is connected to a node between the first and second capacitors. The memory cells are arranged at intersections of bit lines and word lines thereby forming a matrix. The first capacitor of each memory cell is a ferroelectric capacitor using a ferroelectric material as an insulating film. A plate electrode of the first capacitor of each memory cell is held at a first potential when the memory is operated in a first mode and the plate electrode of the first capacitor is held at a second potential when the memory is operated in a second mode. The first potential is different from the second potential.

18 Claims, 11 Drawing Sheets

DATA HOLDING OPERATION IN CONVENTIONAL DRAM

NORMAL OPERATION
↓

```
MODE SETTING. CBR CYCLE.
        ↓
POSE FOR NOT LESS THAN
        100 μs
```

↓

```
DATA HOLDING MODE.
EXECUTION OF SELF-REFRESH
BY SELF-REFRESH TIMER AND
REFRESH ADDRESS COUNTER.
DATA HOLDING CURRENT=
        100 μA
```

↓

```
MODE CANCELLATION
RAS SIGNAL IS CHANGED
    TO HIGH LEVEL
```

↓

```
REFRESH
REFRESHING ALL CELLS
```

↓

NORMAL OPERATION

DATA HOLDING OPERATION USING DRAM OF THE PRESENT INVENTION

NORMAL OPERATION
↓

```
MODE SETTING. CBR CYCLE.
        ↓
POSE FOR NOT LESS THAN
        100 μs
```

↓

```
DATE HOLDING MODE
LOWERING PLATE VOLTAGE
        TO Vss
        ↓
OPERATING PERIPHERAL
CIRCUIT IN SLEEVE MODE
(STOPPING FUNCTIONS
OTHER THAN THAT OF COM-
MAND RECEIVING SECTION)
DATA HOLDING CURRENT =
        1 μA
```

↓

```
MODE CANCELLATION
RAS SIGNAL IS CHANGED
    TO HIGH LEVEL
        ↓
STARTING PERIPHERAL
       CIRCUIT
        ↓
RAISING PLATE VOLTAGE
        TO Vcc
```

↓

```
REFRESH
REFRESHING ALL CELLS
```

↓

NORMAL OPERATION

POWER SUPPLY ON
↓
RECALL OPERATION (INITIAL RAS-ONLY REFRESH INSTRUCTION AFTER POWER SUPPLY IS TURNED ON)
↓
ALLOWING RAS BAR SIGNAL TO GO TO LOW LEVEL...SUPPLY OF PLATE VOLTAGE
↓
EXECUTION OF DUMMY CYCLE
↓
ADDRESS-SPECIFIED RAS-ONLY REFRESH...RECALL OF DESIRED NONVOLATILE DATA
↓
DUMMY ADDRESSING (TERMINATION SIGNAL)
↓
CHANGING BIT LINE PRECHARGE POTENTIAL FROM POTENTION FOR RECALL OPERATION TO THAT FOR DRAM OPERATION

↓
NORMAL DRAM OPERATION
↓

NORMAL CONTROL RESTORE OPERATION (SELF-REFRESH INSTRUCTION)

CBR CYCLE
↓
POSE FOR NOT LESS THAN 100μs
↓
GENERATING SELF-REFRESH SIGNAL...PLATE VOLTAGE IS CHANGED TO Vss

REFRESH NOT REQUIRED = LOW CURRENT CONSUMPTION

NON-STATIONARY CONTROL RESTORE OPERATION (UNEXPECTED POWER SUPPLY SHUT DOWN)

DETECTION OF POWER SUPPLY VOLTAGE LOWERED TO LESS THAN PREDETERMINED VALUE
↓
POTENTIALS OF RAS BAR AND CAS BAR SIGNALS ARE CHANGED TO HIGH LEVEL
↓
RAS TIME-OUT FUNCTION (COMPLETION OF A SERIES OF OPERATIONS OF RAS SYSTEM)
↓
PLATE VOLTAGE IS CHANGED TO Vss AFTER TERMINATION OF RAS SYSTEM OPERATION

TERMINATION

MODE CANCELLATION
(INITIAL RAS-ONLY REFRESH INSTRUCTION AFTER SELF-REFRESH CANCELLATION)
RAS BAR SIGNAL IS MADE TO GO TO HIGH LEVEL
↓
RECALL OPERATION AGAIN (RAS-ONLY REFRESH)

SEMICONDUCTOR MEMORY WITH FERROELECTRIC CAPACITORS

CROSS-REFERENCE TO RELATED APPLICATIONS

This application is related to application Ser. No. 08/257,542, filed Jun. 9, 1994 now U.S. Pat. No. 5,455,786, the disclosure of which is incorporated herein by reference, and is related to application Ser. No. 08/362,239, filed Dec. 22, 1994, the disclosure of which is incorporated herein by reference.

BACKGROUND OF THE INVENTION

The present invention relates to a nonvolatile memory using ferroelectric capacitors. More particularly the present invention relates to a highly reliable nonvolatile memory which use ferroelectric capacitors that are free from fatigue due to read and write of data.

Memories using ferroelectric materials or ferroelectric random access memories (FERAMs) are nonvolatile memories which store data by polarizing the ferroelectric material in different directions. The use of FERAMs provide unique advantages, one being that data stored in the ferroelectric material is not lost when power is no longer available to drive associated memories.

In a conventional ferroelectric memory, polarization is switched when data is read and written. A ferroelectric film forming the ferroelectric memory is fatigued in every writing or reading operation. Consequently, there is a problem that the allowable number of times of write and read operations is extremely restricted in comparison with, for example, a dynamic random access memory. Moreover, since it takes a relatively long time to switch the polarization, there is a problem that the operation time is made longer by the polarization switching.

Figure 15:
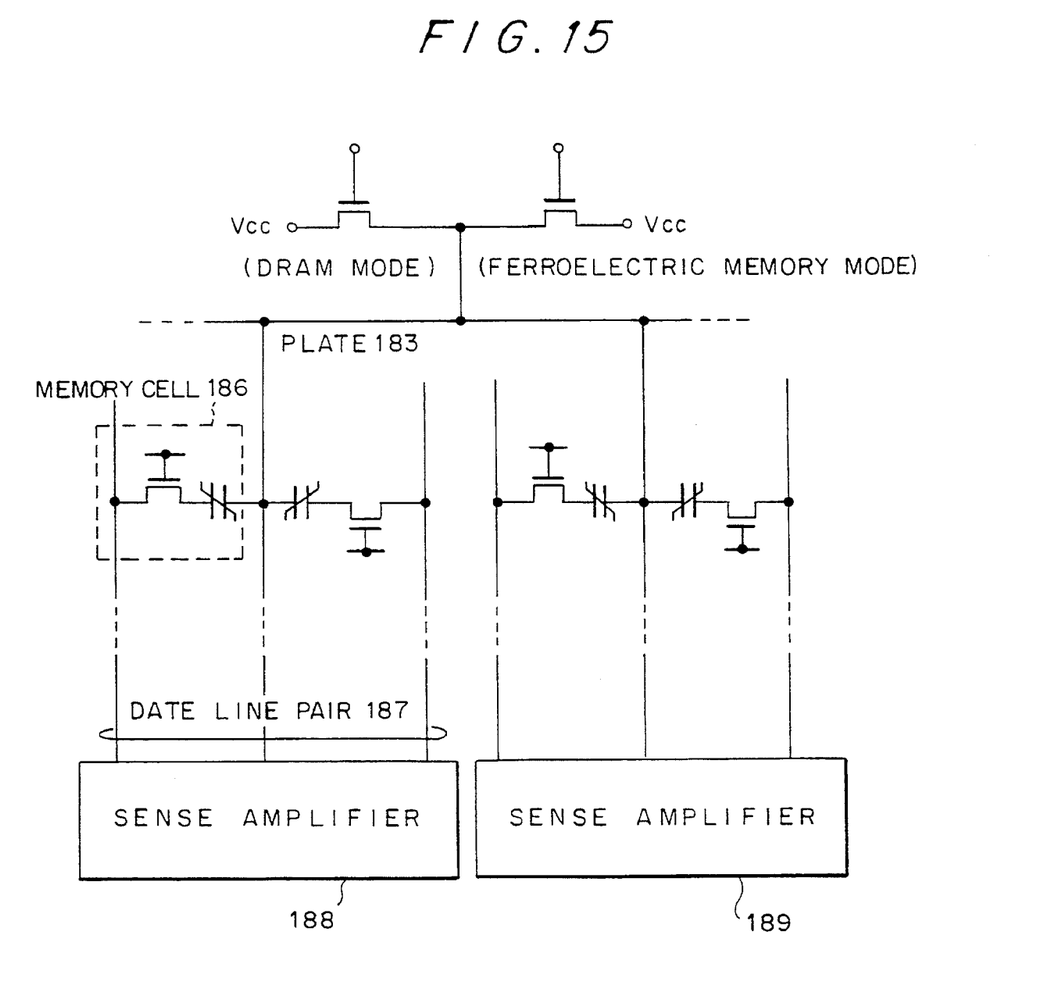
FIG. 15 illustrates a conventional ferroelectric memory.

In order to solve the problems associated with deterioration of the ferroelectric film and the reduction in the reading rate resulting from the switching of polarization, the following method has been proposed in Japanese Patent Laid-Open Publication No. 283176/1991. As shown by an array configuration of FIG. 15, the potential of the plate line is set to, for example, power supply potential (Vcc), and the memory is used as a DRAM in a normal operation. Further, data is stored as nonvolatile information by a FERAM write operation before the power supply is turned off. With the plate line thus set to Vcc, data is prevented from being switched in either case where the potential of a storage unit is ground potential (0) or Vcc. Therefore, the problem of deteriorating the ferroelectric capacitor is avoided and the reading rate is not reduced. If the nonvolatile data is read through the FERAM operation when the power supply is turned on, the FERAM may be made to function effectively as a nonvolatile memory.

However, there still exists a problem, in the above described method when the memory is operated in both DRAM and the FERAM modes. That is, the operation of converting volatile data to nonvolatile data tends to be complicated. More specifically, data is read through the DRAM operation, first, and then the data requires storing as nonvolatile data correspondingly through the FERAM operation with respect to all the memory cells. Particularly when the power supply is turned off by accident, it is extremely difficult to terminate the above conversion operation quickly. Since the polarization of ferroelectric materials is aligned unidirectionally during the use of the memory cells as a DRAM in the above method, all the stored data may be lost when the power supply is turned off by accident.

SUMMARY OF THE INVENTION

An object of the present invention is to provide a high-integration degree, highly reliable nonvolatile memory (ferroelectric memory) which is free from deterioration of ferroelectric capacitors due to the switching of polarization during the normal operation, and which is capable of holding the newest data as nonvolatile data even when the power supply is unexpectedly turned off.

The present invention provides a semiconductor memory which includes a plurality of memory cells each having first and second capacitors connected in series and a field-effect transistor whose source or drain is connected to a node between the first and second capacitors. The memory cells are arranged at intersections of bit lines and word lines to thereby forming a matrix. The first capacitor is a ferroelectric capacitor using a ferroelectric material as an insulating film. A plate electrode of the first capacitor is held at a first potential when the memory cell is operated in a first mode and the plate electrode of the first capacitor is held at a second potential when the memory cell is operated in a second mode. The plate electrode of the second capacitor is connected to ground potential.

To explain the present invention in more detail, the present invention provides a memory cell which includes two capacitors connected in series and a MOS transistor, with a node between the capacitors connected to the source or drain of the MOS transistor. A plurality of the memory cells are interconnected by bit and word lines to form a memory array. At least one of the two capacitors of each memory cell is a ferroelectric capacitor. The opposite plate electrodes of the two capacitors of each memory cell are fixed to power supply potential (Vcc) and ground potential (0 V) respectively. Particularly, the plate electrode of the ferroelectric capacitor is connected to power supply potential while the plate electrode of the other capacitor is connected to ground potential.

The memory array is operated as a dynamic random access memory (DRAM), using the nodes between the capacitors of each memory cell as the storage nodes during normal operation. In each memory cell when the power supply is turned on, the data held as the direction of polarization of the ferroelectric capacitor before the power supply is turned on is detected from fluctuations in the potential at the node. These fluctuations are caused when the potential of the plate electrode of the ferroelectric capacitor on the power supply potential side is raised from ground potential to power supply potential. When the power supply is turned off, volatile information as a storage potential is converted to nonvolatile information as the direction of polarization by lowering the voltage applied to the plate electrode of the ferroelectric capacitor from power supply potential to ground potential.

During the normal operation, the memory functions as a DRAM having both the plate electrode of the ferroelectric capacitor connected to power supply potential and the plate electrode of the other capacitor connected to ground potential. Consequently, the direction of polarization of the ferroelectric film is not switched with respect to the storage potential 0 V or Vcc at the node between the capacitors even though the ferroelectric capacitor is employed as a capacitor, and the ferroelectric capacitor is free from deterioration. When the power supply is turned off, the operation of converting volatile data to nonvolatile data can be performed only by lowering the potential of the plate electrode of the ferroelectric capacitor from power supply potential to ground potential. Therefore, the converting operation as described above can be performed with high reliability even when the power supply is unexpectedly turned off. Since it is unnecessary to divide a plate forming a common plate electrode for the ferroelectric capacitors of the memory cells of the memory array into plate lines, a high integration degree nonvolatile memory can be realized. In other words, a high integration degree and a highly reliable nonvolatile memory can be provided according to the present invention.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

Figure 1:
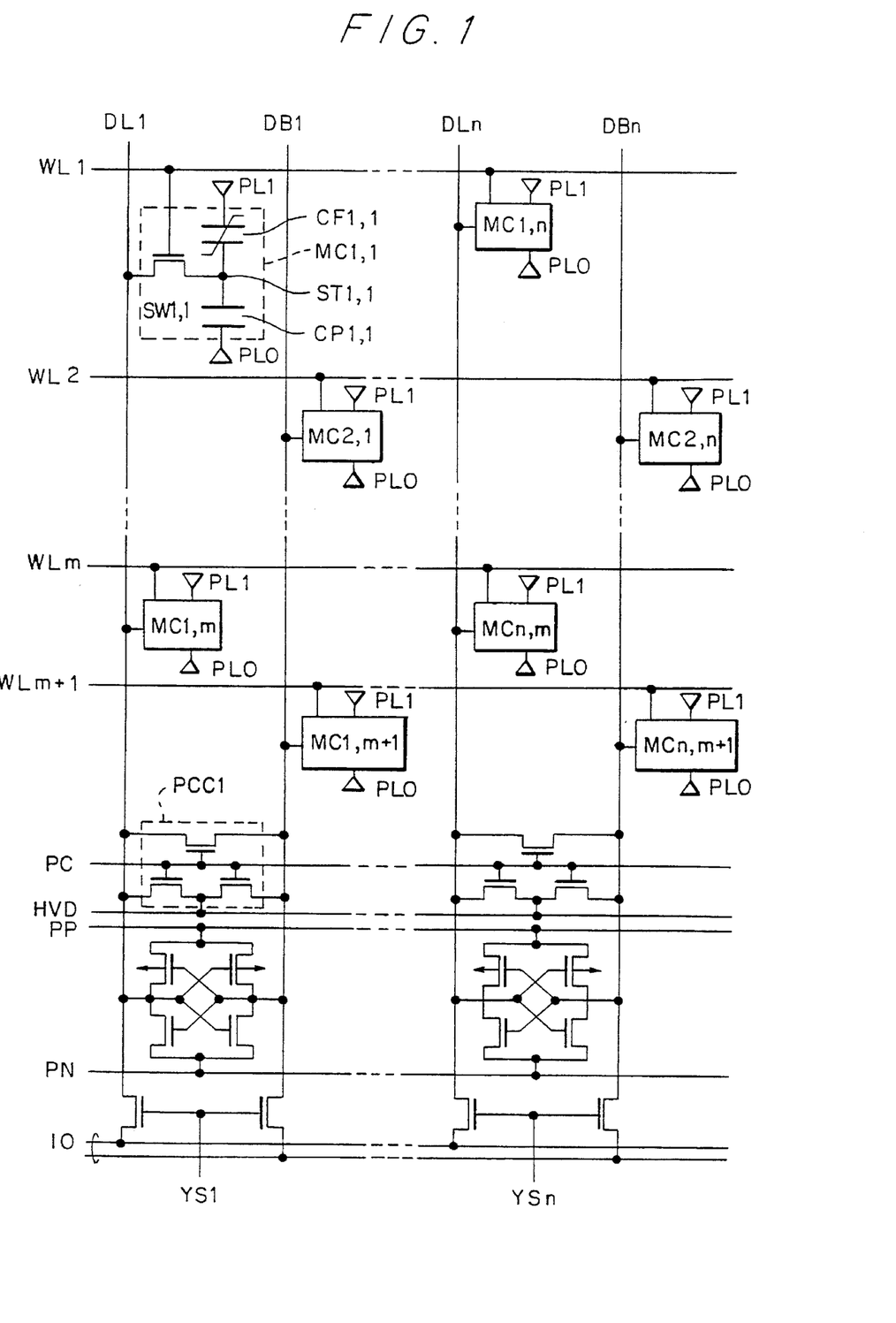
FIG. 1 illustrates a memory array structure of a semiconductor memory embodying the present invention.

FIG. 1 illustrates an embodiment of the present invention which provides a cell array arrangement of a ferroelectric memory. A memory cell, for example MC1,1, includes two capacitors CP1,1, CF1,1, and a field-effect transistor SW 1,1. In FIG. 1, CP1,1 represents a capacitor using a paraelectric material as an insulating film, whereas CF1,1 represents a ferroelectric capacitor using a ferroelectric material as an insulating film. The plate electrode PL0 of the paraelectric capacitor CP1,1 and those of paraelectric capacitors of the other memory cells are connected in common, whereas the plate electrode PL1 of the ferroelectric capacitor CF1,1 and those of ferroelectric capacitors of the other memory cells are also connected in common. The arrangement of the array which includes memory cells is similar to a memory cell array in a well-known dynamic random access memory (DRAM). That is, a memory cell, for example, MC1,1 is connected to one of paired bit lines, for example, either DL1 or DB1. A switch, for example, an SW1,1 is controlled by a word line, for example, WL1 intersecting the bit lines at right angles. The pair of bit lines DL1, DB1 are precharged by a precharge circuit, for example, PCC1 up to the potential of HVD in the stand-by state. A sense amplifier, for example, SA1 detects and amplifies the stored data that has flowed out to the bit lines DL1, DB1 during the reading operation. The stored data thus amplified is then outputted by a select line Y, for example, YS1 to an IO line. The writing operation is performed in reverse to the reading operation.

Figure 2:
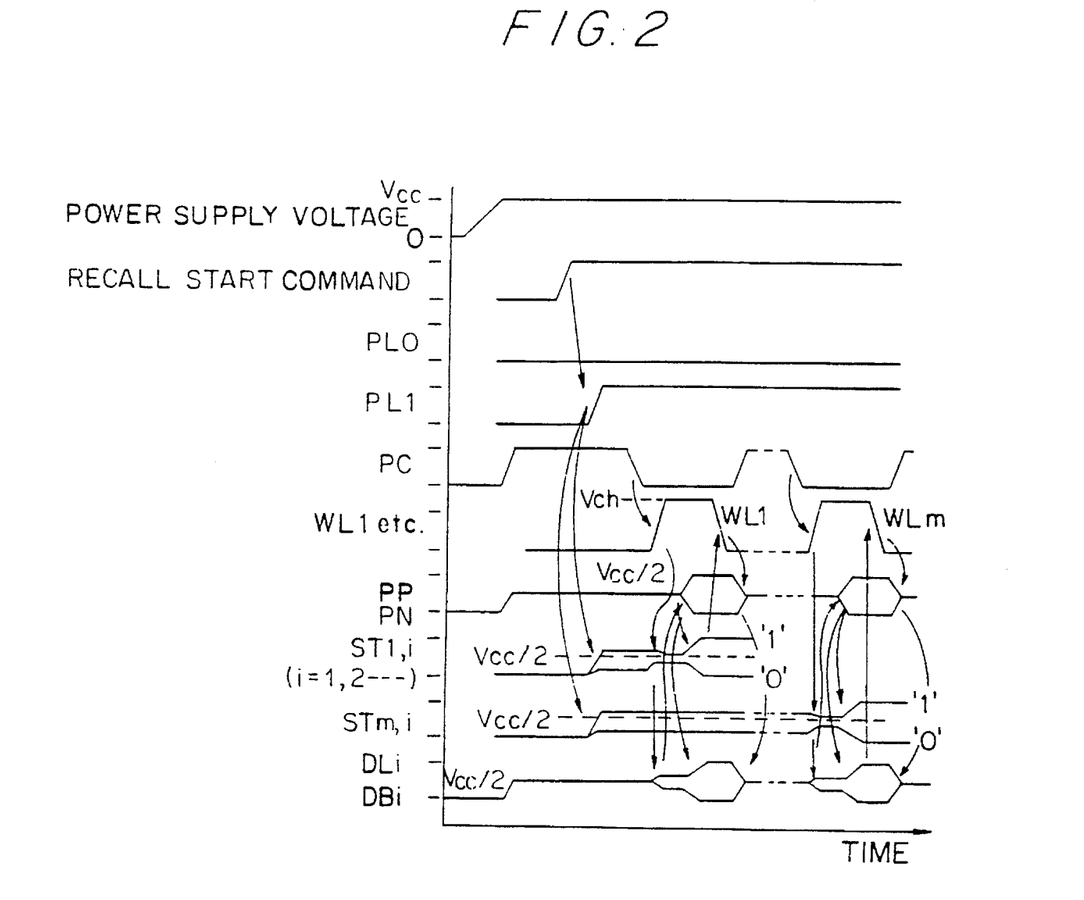
FIG. 2 illustrates a waveform chart when a power supply is turned on in the memory of FIG. 1.

FIG. 2 is a chart of operating waveforms showing the operation of converting nonvolatile data to volatile data when the power supply is turned on in the cell array of FIG. 1. When the power supply voltage is applied to the ferroelectric memory of the present invention, the power supply line and the control line in the memory excluding plates are set to predetermined potentials. When the ferroelectric memory of the present invention starts its operations and nonvolatile data are read out, a recall start command is input. The start command may be generated within the memory upon the detection that the supply voltage has reached a value higher than a predetermined value or may be given from outside. On receiving the start command, the plate electrode line PL1 is boosted to a high level, for example, a power supply potential Vcc while the word lines are all at low levels. Consequently, the potential of a storage STj,i is boosted from Vss (0 V) via the ferroelectric capacitor of the memory cell Cj,i (j, i=1, 2, ... ).

The potential thus boosted at this time depends on the direction of polarization of the ferroelectric capacitor held as nonvolatile data before the power supply is turned on. In other words, the switching of the polarization is not caused by boosting the plate electrode line PL1 if the direction of polarization of the ferroelectric capacitor conforms to the direction when a high voltage with respect to STj,i is applied to PL1. On the other hand, the switching of the polarization occurs by boosting the plate electrode line PL1 if the direction of polarization of the ferroelectric capacitor conforms to the direction when a low voltage with respect to STj,i is applied to PL1. When polarization is switched, the effective capacitance of the ferroelectric capacitor becomes large and the boosted potential of STj,i increases further accordingly. Thus a potential having one of the binary values is held in STj,i according to the nonvolatile data after PL1 is boosted for all the memory cells.

As in the case of a reading operation in a DRAM, the operation of converting nonvolatile data to volatile data is completed when the potential of STj,i is detected and amplified to Vss or Vcc. Therein, a pair of bit lines DLi, DBi (i=1, 2, ... ) are made in a floating state after the control line PC is set to a low level. Subsequently, the word line WL1 is set to the high level, for example, the level of Vch, and the potential of the bit line DLi varies with the potential of STj,i. If the memory is so designed that the potential of the complementary bit line DBi is in an intermediate position of the potential of DLi occurring correspondingly to the binary potential of ST1,i, the sense amplifier of each bit line pair is operated, which makes it possible to detect which one of the binary values the potential of ST1,i is. The sense amplifier is operated by setting the sense amplifier control lines PP and PN to Vcc and Vss, respectively. In order to cause the desired reference potential above to be generated on DBi, only a dummy cell including a paraelectric capacitor having an appropriate capacitance and a switching transistor needs preparing.

Alternatively, as shown in FIG. 2, the effective capacitance of the ferroelectric capacitor and the capacitance of the paraelectric capacitor should be adequately designed so that, upon boosting PL1, the potential of ST1,i is not lower than Vcc/2 when the polarization is switched and the potential of ST1,i is not higher than Vcc/2 when the polarization is not switched, whereby a potential of Vcc/2 can be generated on DBi. If the operation of amplifying the potential of STj,i up to Vcc or Vss is performed for all memory cells by sequentially selecting WLj, the conversion of nonvolatile data to volatile data is terminated.

Figure 3:
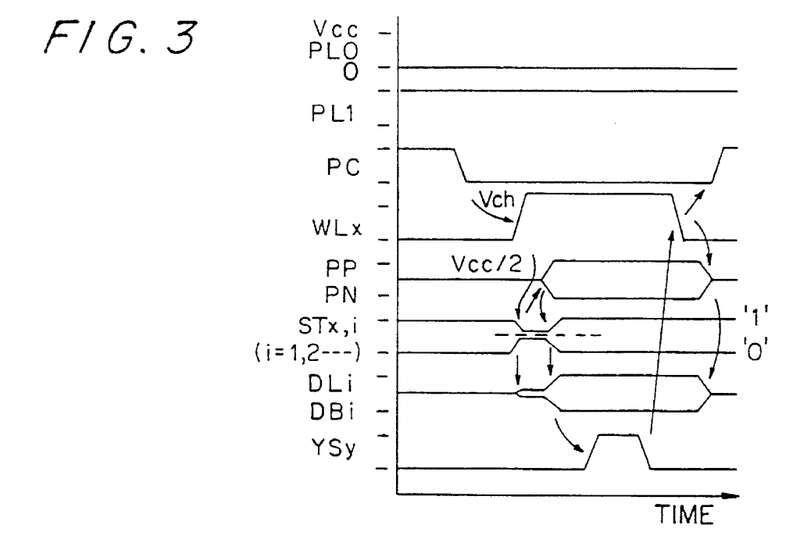
FIG. 3 illustrates a waveform chart during the normal operation of the memory of FIG. 1.

FIG. 3 is a chart of operating waveforms during normal use of the memory array of FIG. 1. That is, when the memory array is operated as a DRAM. During normal use, PL0 and PL1 are set to 0 V and Vcc, respectively. When the reading operation is performed, PC is set to the low level, the bit line pair DLi, DBi are set to HVD, for example, in the floating state of Vcc/2, and a desired word line WLx is set to the high level. Depending on whether the potential of STx,i is Vcc or 0 V, a potential difference arises between DLi and DBi. When the sense amplifier control lines PP and PN are set to Vcc and 0 V respectively, the sense amplifier operates and data are detected and amplified. In this case, the data stored in a memory cell MCx,i is read and fed to the I/O line by setting a Y select line YSy to the high level. In order to rewrite data, rewrite data is given to the I/O line while YSy is kept at the high level, and then the sense amplifier needs only inverting. WLx is returned to the low level after Ysy is returned to the low level, and PP, PN, PC are returned to predetermined values, whereby data is rewritten in MCx, i. Thus a series of reading and writing operations is terminated.

Figure 4:
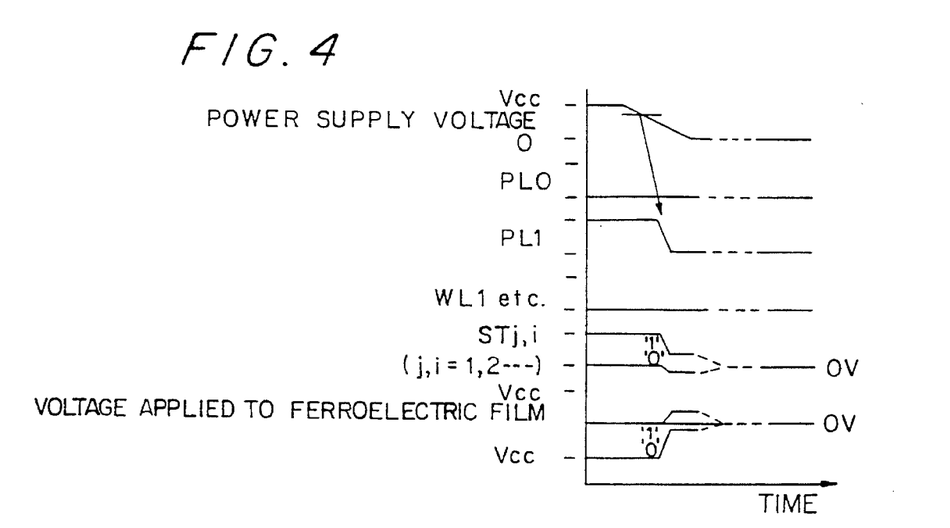
FIG. 4 illustrates a waveform chart when the power supply is shut down in the memory of FIG. 1.

FIG. 4 is a chart of operating waveforms showing the operation of restoring (converting) volatile data to nonvolatile data when the power supply is turned off. When it is detected that the power supply voltage supplied to the memory has been lowered below a predetermined value, PL1 voltage is lowered from Vcc to Vss. At this time, the potentials of the word line WL1 and so forth have to be 0 V. As PL1 is thus lowered in potential, the storage potential of STj,i that has been Vcc or Vss lowers. When STj,i at Vcc in potential, the potential of STj,i settles at a potential between Vcc and Vss after PL1 voltage is lowered from Vcc to Vss, due to the clamp effect of the paraelectric capacitor. Since PL1 is now at Vss, an electric field is applied to the ferroelectric capacitor in a direction opposite to that during the normal operation illustrated referring to FIG. 3, and consequently the direction of polarization is reversed. When STj,i has been at Vss in potential, on the other hand, STj,i is clamped at a voltage lower than Vss by the threshold voltage of a switching transistor of the memory cell. The direction of polarization of the ferroelectric capacitor at this time is the same as that during the normal operation illustrated referring to FIG. 3. Thus the volatile data as the potential of STj,i can be converted at a time to the nonvolatile data as the direction of polarization of the ferroelectric capacitor by lowering the plate electrode PL1 common to all the memory cells from Vcc to Vss.

According to the embodiment of the invention as described in FIGS. 1 through 4, the direction of polarization of the ferroelectric capacitor remains unchanged in writing data as well as reading data during the normal operation, bringing about an effect of realizing a highly reliable nonvolatile memory in which the ferroelectric capacitor film is free from fatigue. Further produced is an effect of preserving stored data as nonvolatile data only by lowering the PL1 potential to Vss when the power supply is turned off. In other words, a highly reliable nonvolatile memory capable of performing a restore operation quickly even when the power supply is shut down by accident is provided.

Figure 5:
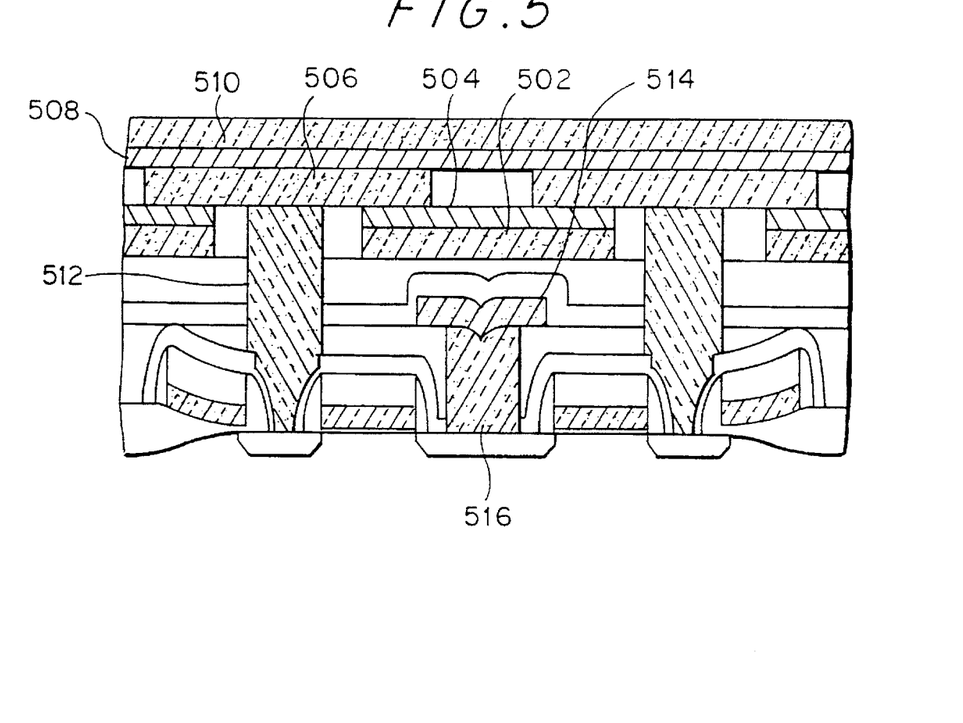
FIG. 5 illustrates an exemplary sectional view of the memory cell of FIG. 1.

FIG. 5 shows the cross-sectional structure of a memory cell in a semiconductor memory according to the present invention as described in FIGS. 1 through 4. As illustrated in FIG. 1, the formation of the memory cell includes connecting two ferroelectric capacitors in series or connecting a ferroelectric capacitor and a paraelectric capacitor connected in series. In order to materialize the structure of the embodiment of the present invention, a lower plate 502, a ferroelectric or high-dielectric film 504, a storage electrode 506, a ferroelectric or a high-dielectric film 508, and an upper plate electrode 510 are stacked in order. The storage electrode is electrically connected via a plug 512 to either the source or drain region of a MOS transistor, whereas a bit line 514 is connected by a plug 516 to the other of the source and drain regions. In order to ensure as large a capacitor area as possible, a capacitor is formed above the bit line 514. When two ferroelectric capacitors are stacked, one of the potentials of the upper and lower plates 510 and 502, respectively, is fixed to Vcc, and the other to Vss. When a ferroelectric capacitor and a paraelectric capacitor are stacked, the potential of the plate electrode in contact with the ferroelectric film is fixed to Vcc, whereas the potential of the plate electrode in contact with the paraelectric capacitor is fixed to Vss. According to the embodiment of the present invention, only a small area is required to obtain a memory cell structure necessary for the semiconductor memory of the invention illustrated in FIGS. 1 through 4. Therefore, a high integration degree, highly reliable nonvolatile memory can be provided.

Figure 6:
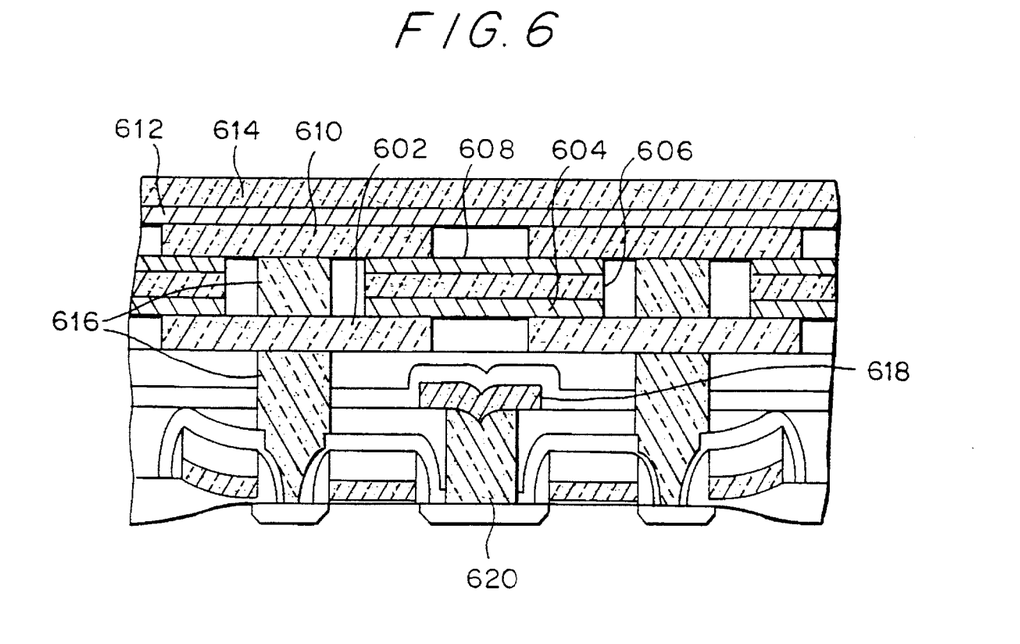
FIG. 6 illustrates another exemplary sectional view of the memory cell of FIG. 1.

FIG. 6 shows the sectional structure of a memory cell different from what is shown in FIG. 5 according to the embodiment of the present invention. There are formed storage electrodes 602 and 610, respectively, in two layers, and a capacitor section includes a storage electrode 602, a ferroelectric or high dielectric film 604, an intermediate plate electrode 606, a ferroelectric or high dielectric film 608, a storage electrode 610, a ferroelectric or high dielectric film 612, and an upper plate electrode 614 are stacked in order. The storage electrodes 602 and 610 in two layers and either of the source and drain regions of a MOS transistor are electrically connected together via a plug 616, whereas a bit line 618 is connected via a plug 620 to the other of the source and drain regions. The way of giving a plate electrode potential is similar to that of FIG. 5. An advantage of this structure is that the area occupied by the capacitor having the intermediate plate electrode 606 and the storage electrode 602 can be increased to twice as large as that of the capacitor comprising the lower plate electrode 502 and the storage electrode 506 of FIG. 5. Therefore there is an advantage that the capacitance values of the capacitors connected in series and the ratio of the capacitance values can be designed easily to minimize the areas and to optimize the ratio.

Figure 7:
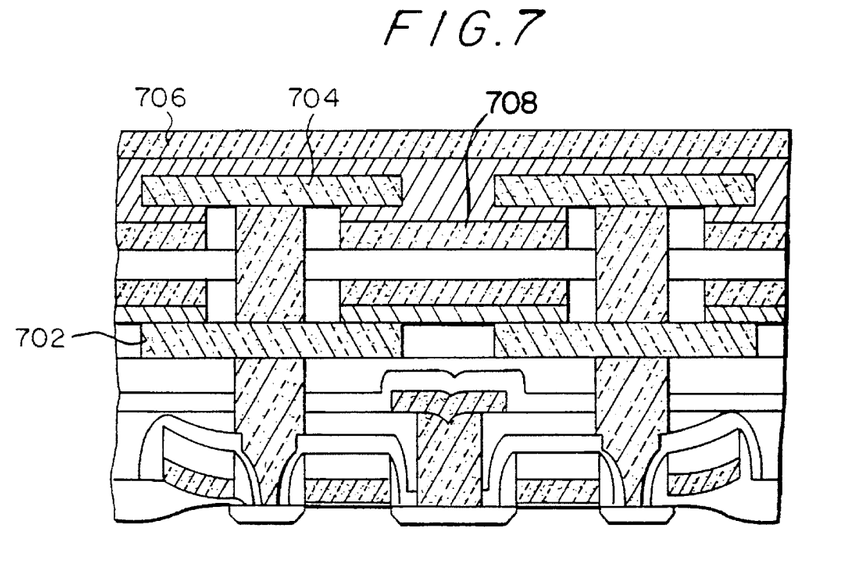
FIG. 7 illustrates still another exemplary sectional view of the memory cell of FIG. 1.

FIG. 7 shows the cross-sectional structure of another memory cell embodying the present invention. In FIG. 7, there are shown storage electrodes 702 and 704 in two layers and an upper plate electrode 706. The advantage of this embodiment of the invention is that the area of a capacitor comprising the upper plate electrode 706 and the storage electrode 704 can be larger than what is shown in FIG. 5. Therefore, the capacitance values of the two capacitors connected in series and the ratio thereof can be easily designed to optimize them in a small area.

Figure 8:
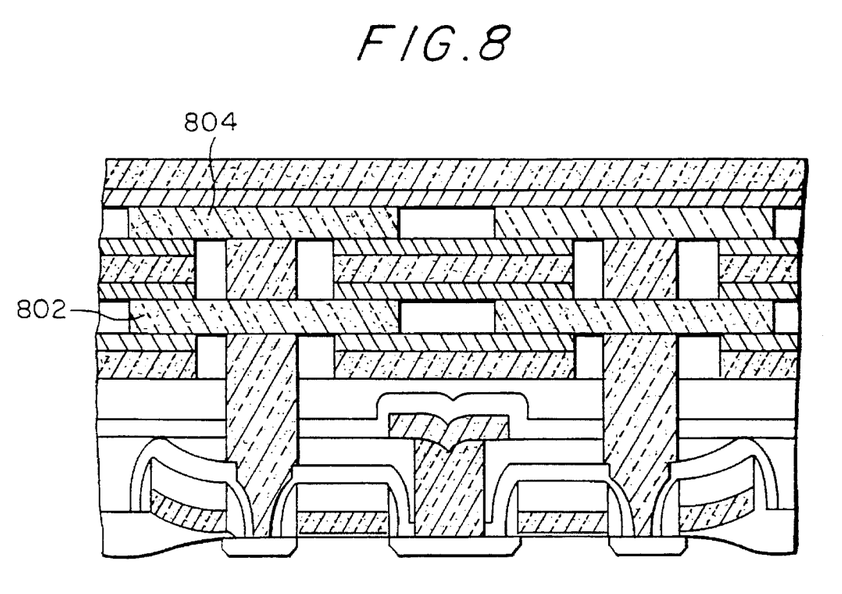
FIG. 8 illustrates still another exemplary sectional view of the memory cell of FIG. 1.

FIG. 8 shows the cross-sectional structure of still another memory cell embodying the present invention. Storage electrodes 820 and 804 in two layers are constructed in this case, wherein one of the capacitors is formed on the upper surface of the upper layer storage electrode 804 and the lower surface of the lower layer storage electrode 802, and the other capacitor is formed in the region therebetween. According to this structure, the advantage is that the areas of the two capacitors can be larger than those of FIG. 5. Therefore, the capacitance values of the two capacitors connected in series and the ratio thereof can be easily designed to minimize the areas and optimize the ratio.

The semiconductor memory according to the present invention as shown in FIGS. 1 through 8 is operated as a DRAM whose plate electrode potential is Vcc during the normal operation, whereby a highly reliable memory having a ferroelectric film which is free from fatigue during the reading and writing operations is obtained. Volatile data during the operation of DRAM can be converted to nonvolatile data as the direction of polarization of the ferroelectric film only by lowering the plate electrode potential to 0 V when the power supply is turned off. Therefore, a highly reliable nonvolatile memory capable of holding data even when the power supply is unexpectedly turned off is obtained. Further, the plate electrode need not be divided into plate electrode lines but can be commonly used within the memory array, whereby the memory cells are reducible in size, and a high integration degree memory is obtainable.

A description is provided below of a method for controlling the semiconductor memory of the present invention from the turn-on of the power supply until the turn-off, which is convenient to the user. Incidentally, part or the whole of the control method to be described below is applicable to any other semiconductor memory in which a ferroelectric memory mode is switched from and to a DRAM mode within a chip.

Figure 9:
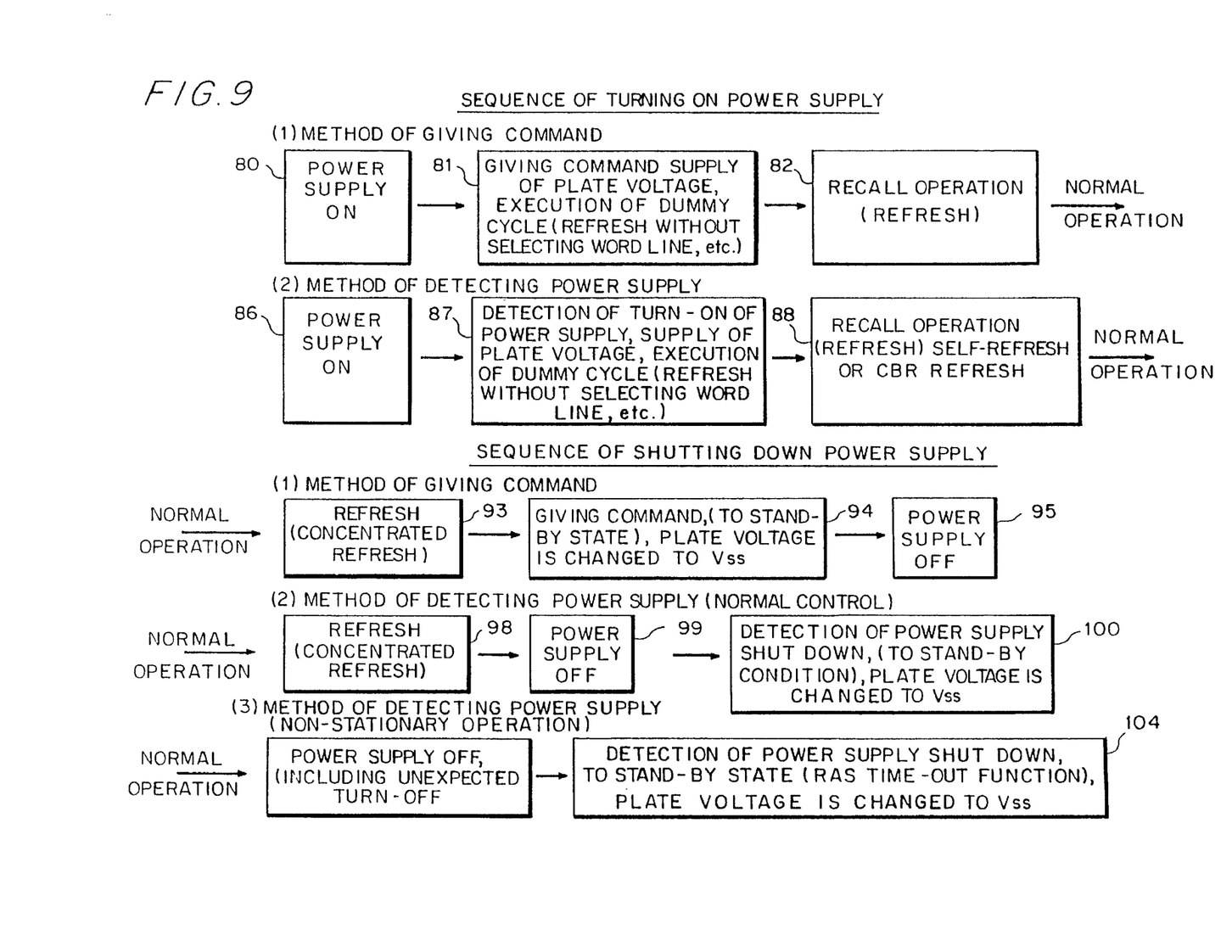
FIG. 9 illustrates a procedure for turning on/off the power supply in the semiconductor memory of the present invention.

FIG. 9 shows an embodiment of the present invention, that is the procedure for turning on/off the power supply of the semiconductor memory of the invention.

When the power supply is turned on, it is necessary to perform a recall operation of converting nonvolatile data as the direction of polarization of the ferroelectric film to volatile data as the storage potential. The recall operation is performed by the method illustrated in FIG. 2, for example. As the method of ordering the start of a series of recall operations, there are two methods shown in FIG. 9: a method for giving a command and a method of detecting the turn-on of the power supply.

According to the method of giving a command, the plate voltage is raised from 0 V to Vcc when the command is given. As in a DRAM, the recall operation is started after a dummy cycle is effected. As is obvious from FIG. 2, the recall operation is implemented by performing a refresh operation of a DRAM. Therefore, the initial refresh operation (e.g., self-refresh, CBR refresh, etc.) after the power supply is turned on becomes a recall operation automatically. However, as shown in the operation of FIG. 2, the conversion of nonvolatile data to volatile data has already been completed within the memory cell after the plate potential is raised. In other words, the polarization is aligned unidirectionally, and there arises a potential difference in the storage potential corresponding to "1", "0". The aforementioned recall operation has to be performed quickly before data as the storage potential is caused to disappear because of leakage current. Another point to be noticed is that the precharged potential of the bit line in the recall operation may be required to be different from the potential in the DRAM operation. In other words, the capacitance ratio of the ferroelectric capacitor to the paraelectric capacitor can be designed so that the Vcc/2 level of the precharge potential of the DRAM is between the signals "1", "0" in the recall operation. However, such a design may be difficult, and in such cases it is necessary to activate the dummy cell only when the recall operation is performed.

In contrast to the method of giving a command, the method of detecting the turn-on of the power supply includes the step of detecting the turn-on of the power supply, raising the plate voltage, and performing the recall operation. The refresh operation, namely, the recall operation is not carried out according to a signal from outside but may be carried out automatically during a series of steps of turning on the power supply to work according to a signal generated simultaneously with the turn-on of the power supply. The semiconductor memory according to the present invention is usable like an ordinary DRAM after the steps of turning on the power supply.

In turning off the power supply, on the other hand, the plate has to be lowered to 0 V before the storage potential is lowered to 0 V as illustrated in FIG. 4. For this purpose, there are methods for giving a command and a method for detecting the turn-off of the power supply.

By the method of giving a command, the plate potential is lowered to 0 V when the command is given. As is obvious from the operating waveform at the time of turn-off of the power supply shown in FIG. 4, the storage potential on the high level side when the plate potential is lowered to 0 V should be as close to Vcc as possible. Therefore, all the memory cells are refreshed before the command is given.

By the method for detecting the turn-off of the power supply, when the power supply is lowered below a predetermined value, on the other hand, the plate potential is lowered to 0 V. As in the case of the method of giving a command, the refresh operation is preferably performed before the power supply is turned off. The unexpected power supply shut down can be dealt with by the method of detecting the turn-off of the power supply. However, the conversion of volatile data to nonvolatile data is not properly implemented if the plate potential is lowered before the end of the reading operation because the storage potential remains substantially at the Vcc/2 level irrespective of the stored data. In order to prevent such a malfunction, the RAS time-out function used in a DRAM can be utilized. In other words, a stand-by state is created in which RAS and CAS bar signals are caused to be at the high level when the power supply voltage is detected having lowered to not higher than a predetermined value. In this state, even though the RAS bar signal returns to the high level within a period shorter than the value determined by the specifications (in this case, the data in the memory may be on the way of being read), the RAS time-out function performs a series of operations in the RAS system, that is, the operations from detecting and amplifying the stored data by means of the sense amplifier up to deactivating the word line. While the RAS system is operating, a flag indicating this operation remains at the high level, for example, thus preventing the plate potential from being lowered. When the flag goes to the low level on the termination of the operation of the RAS system, the plate potential is lowered to 0 V. By this method, conversion to nonvolatile data can be effected when the power supply is unexpectedly turned off.

By properly combining several steps of the procedure for turning on/off the power supply shown in FIG. 9, the semiconductor memory of the present invention can be controlled with a high reliability from the turn-on of the power supply until the turn-off through such a method convenient to the user.

Figure 10:
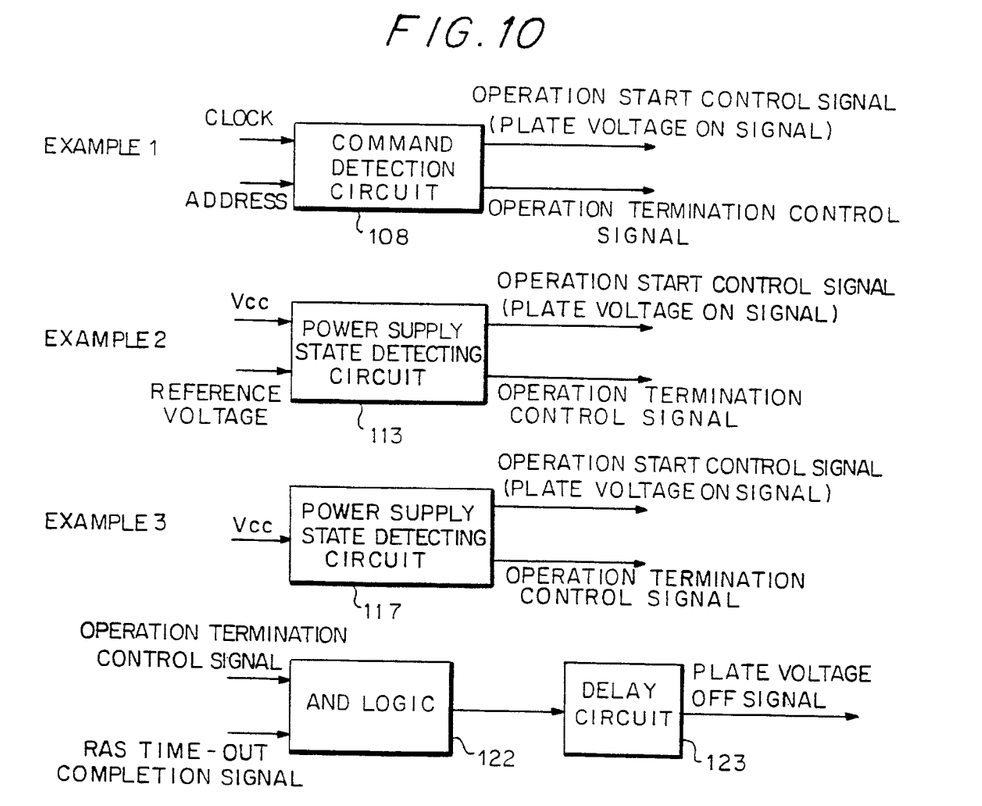
FIG. 10 illustrates a block diagram of a control circuit for use in FIG. 9.

FIG. 10 is a block diagram of a control circuit necessary for executing the steps of FIG. 9. As shown in Example 1 of FIG. 10, a command to turn on/off the power supply can be created from a clock signal or an address to be given from outside. A signal (e.g., RAS bar and CAS bar signals and the like) as in a DRAM may be utilized as the clock signal. A circuit for detecting the state of the power supply, on the other hand, generates an operation start control signal and a operation termination control signal based on Vcc and reference voltage as shown by Example 2. Alternatively, the circuit generates a control signal from only Vcc as shown by Example 3. The operation start control signal as it is serves as a plate voltage ON signal, whereas the result of AND operation of the operation termination control signal and the RAS time-out completion signal is used as a plate voltage OFF signal. This process is intended to deal with also the unexpected power supply shut down. According to this embodiment of the invention, the on- and off-state of the power supply of the semiconductor memory of the present invention is controllable with a high reliability by combining external signals as in a DRAM.

Figure 11:
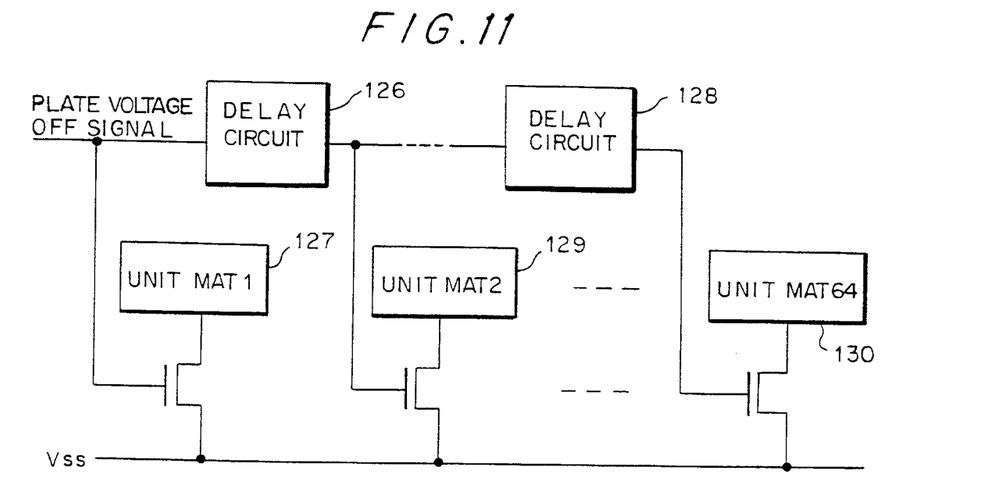
FIG. 11 illustrates an exemplary circuit for lowering the plate potential to 0 V when the power supply is shut down.

FIG. 11 shows an example of the structure of the plate voltage OFF circuit. In order to suppress the peak value of discharge current to the plate potential Vss, the plate voltage OFF signal is used to cause discharge at different timings from a unit mat 1 up to a mat 64. In this case, the mat is a unit block comprising an array of memory cells in an adjoining region. According to this embodiment of the invention, the peak value of the discharge current produced when the power supply is turned off can be suppressed, so that the power supply shut down procedure is performed stably.

Figure 12:
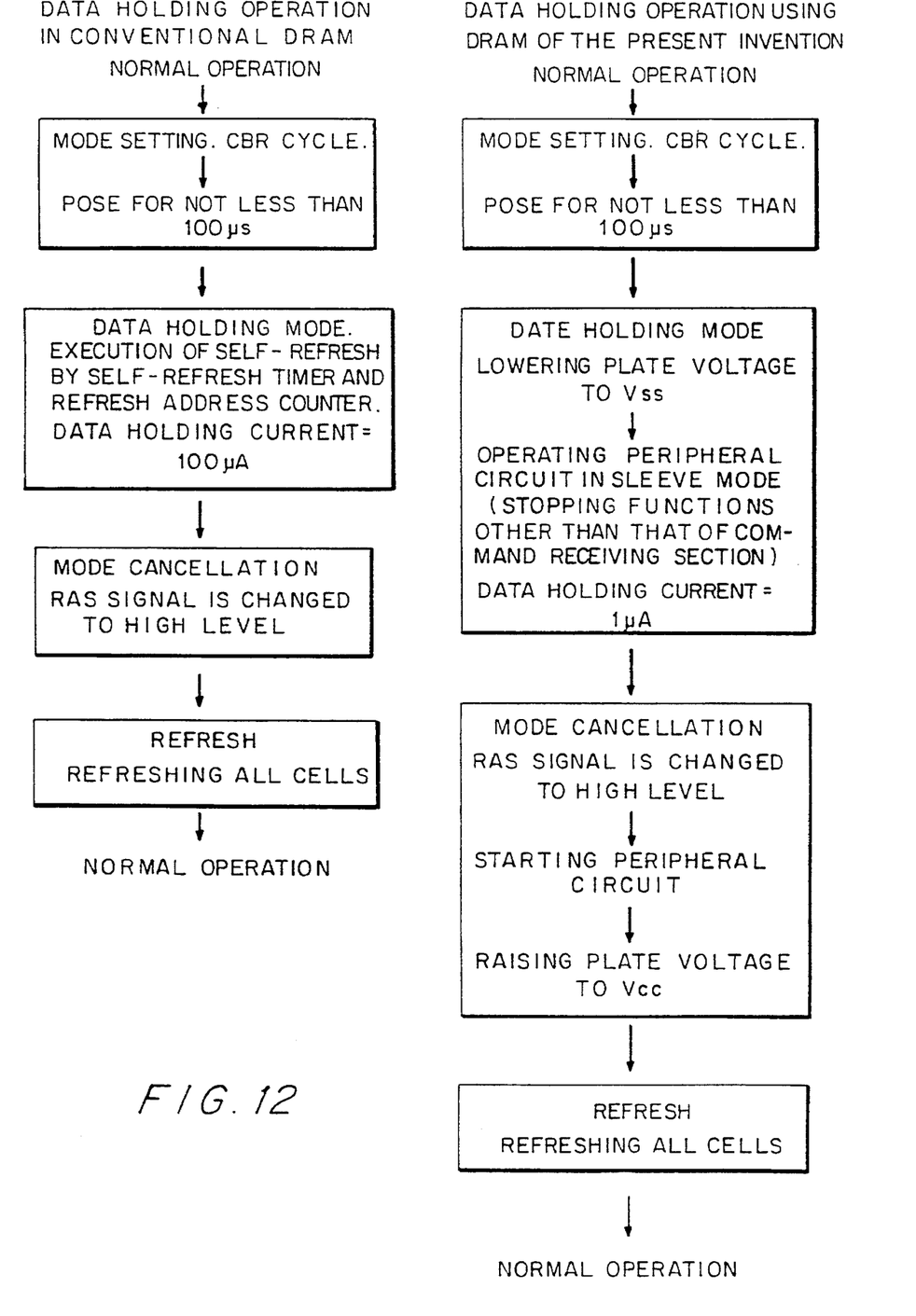
FIG. 12 illustrates an operation of holding data in the semiconductor memory of the present invention.

FIG. 12 illustrates a method for holding data by using a low consumption current in a semiconductor memory of the invention, unlike the methods in which data are held by self-refresh operation in conventional DRAMs. In the conventional DRAM, the self-refresh operation is started after the CBR cycle (wherein the CAS bar is made to fall prior to the RAS bar) is started and kept in this state for more than 100 μsec. Thus data can be held with a low current consumption of 100 μA. When the refresh operation is performed for all the memory cells when the RAS bar signal returns to the high level, the normal operation can be restarted. In the semiconductor memory according to the present invention, the user is able to reduce the current consumption further with the same command as that in the conventional DRAMs by the following method. When the self-refresh mode is established, the plate voltage is lowered to 0 V and the operation of the circuit excluding the section for receiving the command is stopped. By lowering the plate voltage to 0 V, the volatile data as the storage potential is converted to the nonvolatile data as the direction of polarization, whereby the periodical refresh operation for holding data is unnecessary. Consequently, in the stand-by state only the peripheral circuit of the section for receiving the command consumes current. Thus the data holding current can be decreased to approximately 1 μA, the value of which is smaller by two digits than that of the conventional DRAM. In order to restart the normal operation, it is only necessary to perform the refresh operation for all the memory cells after the RAS bar is returned to the high level as in the case of the conventional DRAM. The peripheral circuit within the memory is started when the RAS bar is returned to the high level, and the plate voltage is returned to Vcc. According to this embodiment of the invention, it is possible to achieve a stand-by state in which data holding current is extremely small through all the same steps as those in the conventional DRAMs.

A description has been given of a user-friendly method of controlling the semiconductor memory of the present invention with a high reliability from the turn-on of the power supply to the turn-off. Subsequently, a series of operations from turn-on of the power supply to turn-off will be described with reference to a specific example.

Figure 13:
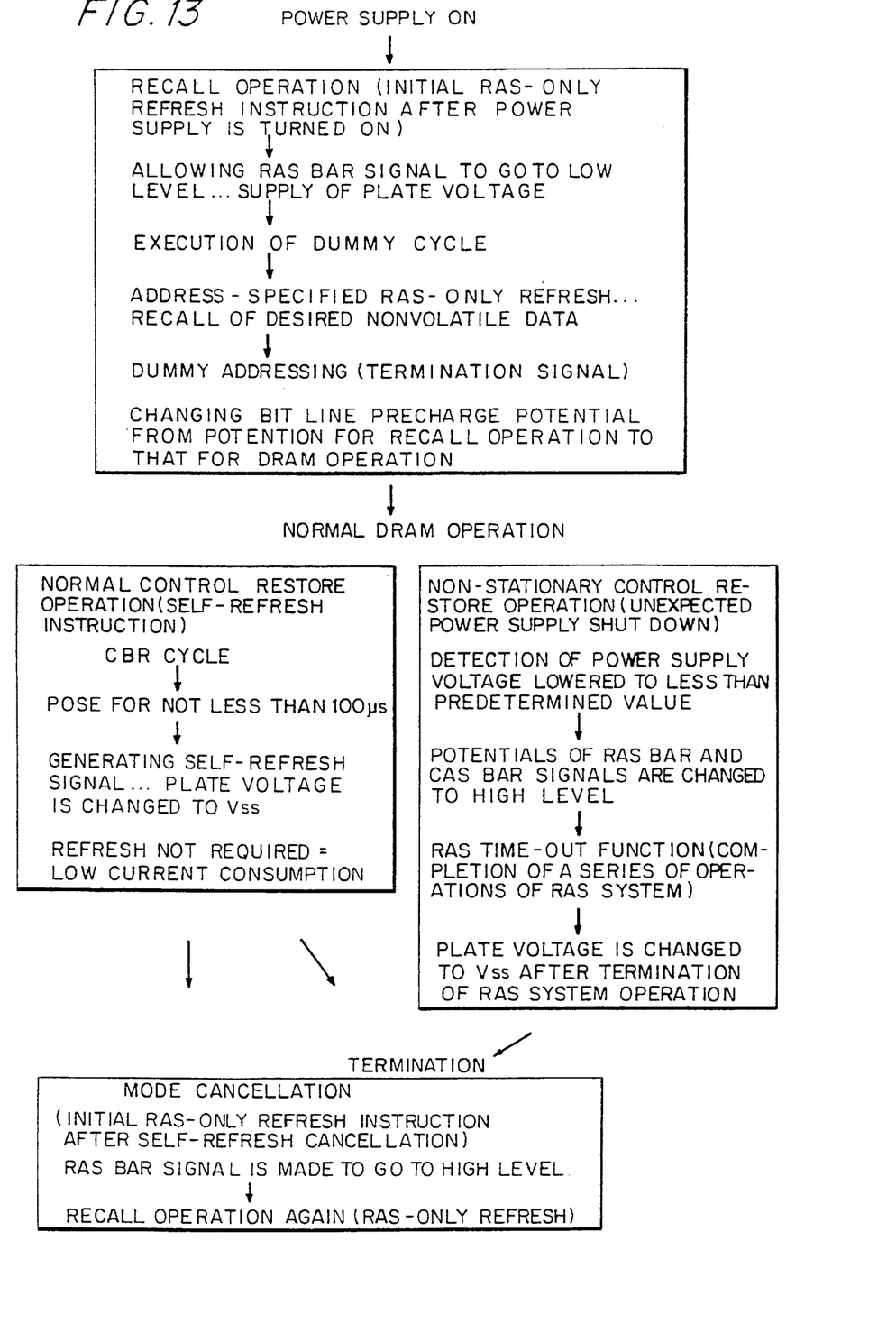
FIG. 13 illustrates a method for controlling the semiconductor memory of the present invention, which can be handled like a DRAM.

FIG. 13 illustrates a method for controlling the semiconductor memory of the present invention using the same command as in a DRAM. First, the recall operation is performed under the first RAS-only refresh instruction after the power supply is turned on. In other words, a dummy cycle (refresh which select no word line) is first executed after the power supply is turned on as in an ordinary DRAM. At this time, upon the detecting the initial change of the RAS bar signal to the low level, the plate potential is boosted to Vcc. When the dummy cycle is terminated, the plate potential is stably held at Vcc level. Then an address-specified RAS-only refresh operation is performed for a memory cell to be recalled. As illustrated in FIG. 2, the nonvolatile data is converted to the volatile data as the storage potential through the RAS-only refresh operation since the recall operation is performed in the same way as that of the refresh operation of a DRAM. When the precharged potential of the bit line during the recall operation differs from that during the DRAM operation, the precharged potential is changed for DRAM by feeding a recall termination signal after the recall operation is terminated. Alternatively when a dummy cell is used during the recall operation, the dummy cell is deactivated by means of the recall termination signal. The recall termination signal is given according to, for example, a dummy-address specified RAS-only refresh instruction.

The memory functions as an ordinary DRAM after the termination of the recall operation. When the power supply is turned off, volatile data stored in the memory functioning as a DRAM has to be converted to nonvolatile data as the direction of polarization of the ferroelectric material. As illustrated in FIG. 4, the converting operation can be performed by only lowering the plate potential to 0 V in the semiconductor memory of the present invention. As shown in FIG. 13, a command is used for the converting operation when the power supply is intentionally turned off, whereas when the power supply is unexpectedly turned off, a power supply state detection circuit is used to perform the converting operation. A self-refresh instruction is used as the command when the power supply is intentionally turned off. The self-refresh instruction in the semiconductor memory of the present invention is different from the self-refresh instruction for periodically refreshing all the memory cells in the ordinary DRAM, but is only for simply lowering the plate potential to 0 V. Since volatile data is thus converted to nonvolatile data, it is no longer necessary to perform the refresh operation. When the power supply is turned off in this state, data is held.

Alternatively, as illustrated in FIG. 12, only the following technique may be adopted: only the peripheral circuit of the section for receiving the command is kept operating, and the recall operation is performed immediately after the self-refresh is released. Even in an ordinary DRAM, it is prescribed in the specification to perform the refresh operation after the self-refresh is released, and what is similar to this operation is the recall operation in the semiconductor memory of the present invention. On the other hand, the power supply state detection circuit operates when the power supply is unexpectedly turned off. In other words, the RAS bar signal and the CAS bar signal are first set to the high level when the supply voltage is lowered to the predetermined value and put in the stand-by state. When the power supply is turned off even during the reading operation and even when the RAS bar signal remaining at the low level returns to the high level earlier than the time prescribed in the specification, a series of operations in the RAS system is completed by means of the RAS time-out function. Then the plate potential is lowered to 0 V after a signal representing the termination of the RAS system operation is fed. Since RAS time-out function is thus provided the word line is at the low level at all times when the plate potential is lowered to 0 V, whereby the conversion to nonvolatile data can be carried out without any error. Accordingly, it is possible to realize a highly reliable nonvolatile memory which can be handled like a DRAM.

Figure 14:
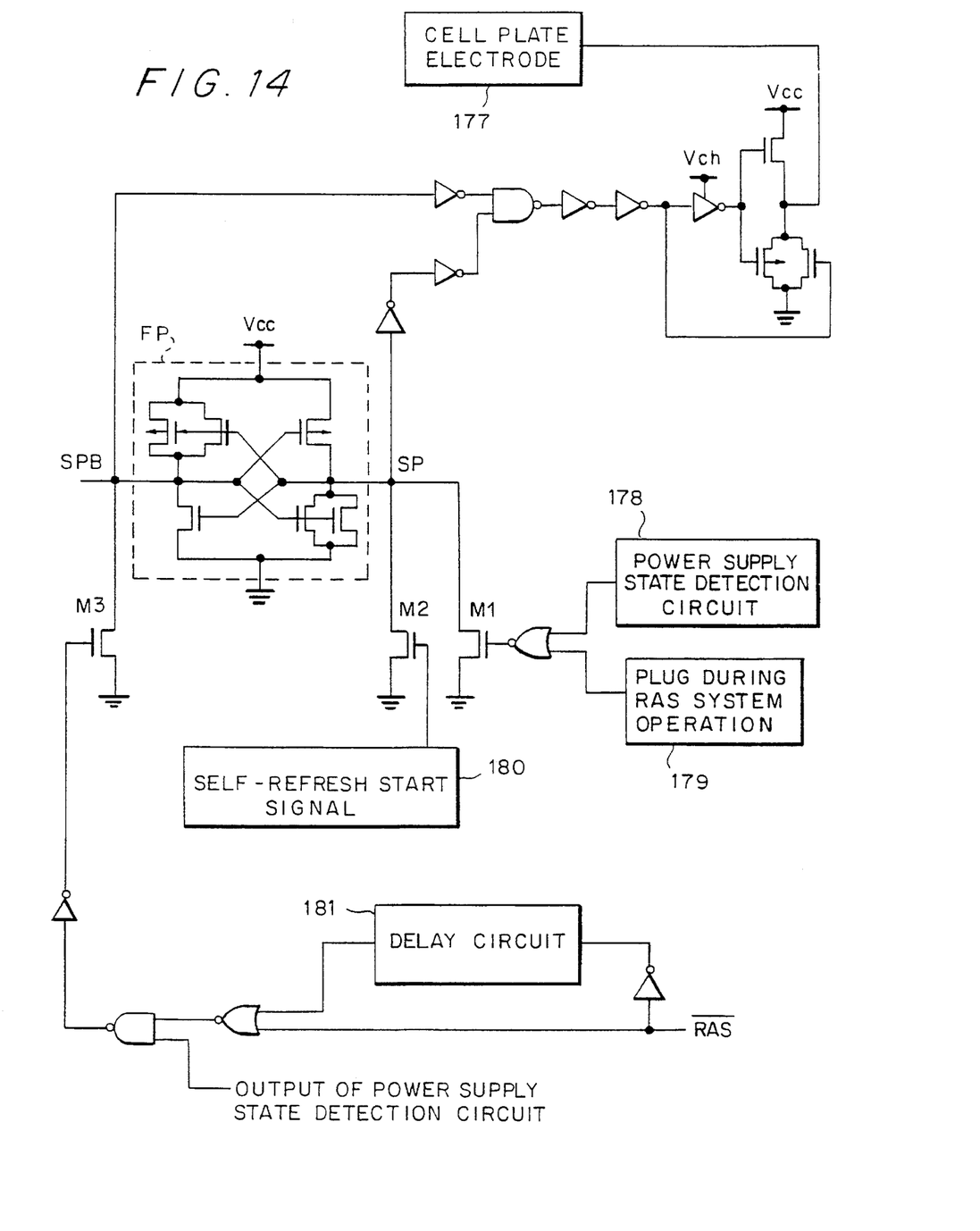
FIG. 14 illustrates an exemplary plate potential control circuit fit for use in the semiconductor memory according to the present invention.

FIG. 14 illustrates a specific arrangement of a circuit for providing plate potential in accordance with the control method of FIG. 13, as an embodiment of the present invention. While the node SP of a flip-flop circuit FP is at the high level, the plate potential is Vcc, whereas when it is at the low level, the plate potential is 0 V. The potential of SP is controlled through the method of FIG. 13 as follows. First, SP is set to the low level and SPB to the high level when the power supply is turned on. This is due to the fact that the sizes of n- and p-channel MOS transistors have been unevenly designed, and that the power supply state detection circuit outputs a signal at the low level when the power supply is initially started, thus turning M1 ON and M2 OFF. Since SP is at the low level, the plate potential is 0 V immediately after the power supply is turned on. When the RAS bar signal is caused to fall after the power supply is turned on, M3 is temporarily turned on and SPB goes to the low level, that is, SP goes set to the high level. Consequently, the plate potential is booted to Vcc, and nonvolatile data is converted to volatile data. Although the RAS bar signal is frequently caused to fall also during the recall operation and the normal operation of DRAM, only 0 V is rewritten in SPB and the plate potential does not change. As a result of OR operation of the RAS bar signal and its inverted signal, there is generated a pulse correspondingly to the fall of the RAS bar signal. The delay by the delay circuit may be designed to be nearly equal to the time for which generally the RAS bar signal is maintained at the low level in operations and the time taken to rewrite FP, namely, approximately 100 nsec. When the power supply is turned off, the self-refresh instruction as described referring to FIG. 13 is given. When the RAS bar signal is caused to fall as the self-refresh instruction according to the CBR cycle, M3 is temporarily (for approximately 100 nsec) turned on again. However, a self-refresh start signal is generated 100 μsec later, and M2 is turned in this case. Then the potential of SP is lowered to the low level and the plate potential is lowered to 0 V. When the power supply is unexpectedly turned off and the supply voltage is lowered to the predetermined level, the output of the power supply state detection circuit is lowered to the low level. When the RAS system is being operated, M1 is turned on after the operation of the system. As a result, SP goes to the low level, and the plate potential is lowered to 0 V. Incidentally, M1, M2 and M3 are designed so that they are large enough to invert the flip-flop circuit FP. According to the aforementioned embodiments of the present invention, the plate potential is controllable by the steps shown in FIG. 13 and it is possible to realize a highly reliable nonvolatile memory which can be handled like a DRAM.

A highly reliable nonvolatile memory obtainable according to the present invention is capable of reducing the deterioration of the ferroelectric capacitor attributed to the reading and writing operations, and stably holding nonvolatile data even when the power supply is unexpectedly turned off.

While the present invention has been described in detail and pictorially in the accompanying drawings it is not limited to such details since many changes and modifications recognizable to those of ordinary skill in the art may be made to the invention without departing from the spirit and the scope thereof.

We claim:

1. A semiconductor memory comprising:
   a plurality of memory cells each having first and second capacitors connected in series and a field-effect transistor whose source or drain is connected to a node between said first and second capacitors, said memory cells being arranged at intersections of bit lines and word lines thereby forming a matrix;
   wherein said first capacitor is a ferroelectric capacitor using a ferroelectric material as an insulating film;
   wherein a plate electrode of said first capacitor is held at a power supply potential when said memory is operated in a first mode and said plate electrode of said first capacitor is held at a ground potential when said memory is operated in a second mode; and
   wherein a plate electrode of said second capacitor is held at a ground potential during a mode changing operation between said first mode and said second mode.

2. A semiconductor memory according to claim 1, further comprising:
   a circuit which changes the potential of said plate electrode of said power supply capacitor from said first potential to said ground potential by applying a termination signal to said semiconductor memory.

3. A semiconductor memory according to claim 2, wherein said termination signal is generated within said semiconductor memory when said power supply potential is detected as having been lowered to a level not higher than a predetermined value.

4. A semiconductor memory according to claim 2, wherein said termination signal is provided by a same external signal as a self-refresh signal when said semiconductor memory is a Dynamic Random Access Memory (DRAM).

5. A semiconductor memory according to claim 2, wherein a common plate is provided for said plate electrodes of said first capacitors of said memory cells and said common plate is divided for each memory cell and a potential of said common plate is changed from said power supply potential to said ground potential in such a manner that potentials of divided plates are changed at different timings.

6. A semiconductor memory according to claim 1, wherein said plate electrode of said first capacitor is changed from said ground potential to said power supply potential by applying a start signal to said semiconductor memory.

7. A semiconductor memory according to claim 6, wherein said start signal is generated within said semiconductor memory when supply voltage applied to the memory is detected as having reached or exceeded a predetermined value.

8. A semiconductor memory according to claim 2, further comprising:
   a register for ordering supply or suspension of said power supply potential to said plate electrode of said power supply capacitor being held at said first potential during normal operation.

9. A semiconductor memory according to claim 3, further comprising:

a register for ordering supply or suspension of said power supply potential to said plate electrode of said power supply capacitor being held at said first potential during normal operation.

10. A semiconductor memory according to claim 4, further comprising:

a register for ordering supply or suspension of said power supply potential to said plate electrode of said power supply capacitor being held at said first potential during normal operation.

11. A semiconductor memory according to claim 5, further comprising:

a register for ordering supply or suspension of said power supply potential to said plate electrode of said power supply capacitor being held at said first potential during normal operation.

12. A semiconductor memory according to claim 6, further comprising:

a register for ordering supply or suspension of said power supply potential to said plate electrode of said power supply capacitor being held at said first potential during normal operation.

13. A semiconductor memory according to claim 7, further comprising:

a register for ordering supply or suspension of said power supply potential to said plate electrode of said power supply capacitor being held at said first potential during normal operation.

14. A semiconductor memory according to claim 8, further comprising:

a register for ordering supply or suspension of said power supply potential to said plate electrode of said power supply capacitor being held at said first potential during normal operation.

15. A semiconductor memory according to claim 1 wherein data to be stored at said node between said first and second capacitors has a potential between said power supply and ground potentials.

16. A semiconductor memory according to claim 1 wherein said word lines are held at said ground potential during a transition mode not including reading and writing operations.

17. A semiconductor memory according to claim 6 wherein said start signal is provided by an external signal when a potential of said plate electrode of said first capacitor is said ground potential, as a RAS signal in a DRAM.

18. A semiconductor memory according to claim 2 further comprising:

means for performing the change of the potential of said plate electrode of said first capacitor after a series of normal operations from activation of one of said word lines to deactivation of said word line when said termination signal is applied to said semiconductor memory after a signal for ordering the activation of said word line has been generated.

* * * * *